United States Patent [19]

Joo

[11] Patent Number: 6,113,402
[45] Date of Patent: Sep. 5, 2000

[54] STRUCTURE FOR MOUNTING PRINTED CIRCUIT BOARD IN AN ELECTRONIC APPLIANCE

[75] Inventor: Yun-Seong Joo, Kyunggi-do, Rep. of Korea

[73] Assignee: SamSung Electronics Co., Ltd., Kyungki-do, Rep. of Korea

[21] Appl. No.: 09/060,379

[22] Filed: Apr. 15, 1998

[30] Foreign Application Priority Data

Apr. 15, 1997 [KR] Rep. of Korea ................. 97/13726

[51] Int. Cl.⁷ .................................................. H01R 13/62
[52] U.S. Cl. ........................................... 439/157; 439/160
[58] Field of Search .................................. 439/157, 159, 439/160, 327; 361/686, 798

[56] References Cited

U.S. PATENT DOCUMENTS

| | | | |
|---|---|---|---|
| 4,628,413 | 12/1986 | Speraw | 361/798 |
| 5,140,501 | 8/1992 | Takahashi et al. | 361/798 |
| 5,417,513 | 5/1995 | Hayashi | 403/321 |
| 5,428,507 | 6/1995 | Chatel et al. | 361/798 |
| 5,541,809 | 7/1996 | Kakizaki et al. | 361/683 |
| 5,558,528 | 9/1996 | Cheng et al. | 439/160 |
| 5,600,542 | 2/1997 | Malgouires | 361/732 |
| 5,668,696 | 9/1997 | Schmitt | 361/685 |
| 5,676,556 | 10/1997 | Yamaguchi et al. | 439/157 |
| 5,692,208 | 11/1997 | Felcman et al. | 395/800 |
| 5,781,417 | 7/1998 | Albani et al. | 361/801 |
| 5,848,906 | 12/1998 | Glusker et al. | 439/157 |
| 5,853,297 | 12/1998 | Moulton et al. | 439/327 |

*Primary Examiner*—Brian Sircus
*Assistant Examiner*—Michael C. Zarroli
*Attorney, Agent, or Firm*—Robert E. Bushnell, Esq.

[57] ABSTRACT

A structure for mounting a PCB in electronic appliances such as computers includes, a slidable moving arrangement disposed on the bottom surface of a PCB, while a PCB guide arrangement is disposed on the chassis of an electronic appliance for guiding a linear movement of the slidable moving arrangement. Two connectors are respectively provided on the PCB and the chassis at corresponding positions, the connectors being electrically connected to each other when the PCB is completely set on the chassis. A locking lever is rotatably mounted to the chassis so as to be rotated in opposite directions by the slidable moving arrangement normally maintaining the position of the PCB on the chassis and selectively releasing the PCB from the chassis. The structure of this invention detachably, slidably, quickly, precisely and easily mounts a PCB to the chassis.

13 Claims, 9 Drawing Sheets

STRUCTURE FOR MOUNTING PRINTED CIRCUIT BOARD IN AN ELECTRONIC APPLIANCE

CLAIM OF PRIORITY

This application makes reference to, incorporates the same herein, and claims all benefits accruing under 35 U.S.C. §119 from an application for STRUCTURE FOR MOUNTING PRINTED CIRCUIT BOARD IN ELECTRONIC APPLIANCES earlier filed in the Korean Industrial Property Office on the 15$^{th}$ of Sep. 1997 and there duly assigned Ser. No. 13726/1997.

BACKGROUND OF THE INVENTION

1. Field of the Invention

The present invention relates, in general, to a structure for mounting a printed circuit board (PCB) in an electronic appliance such as a computer and, more particularly, to a structure for detachably and slidably mounting a PCB in an electronic appliance, thus allowing a user to easily mount and remove the PCB to or from the chassis of the electronic appliance.

2. Description of the Related Art

In an earlier configuration of a computer, a chassis is provided in the housing of the computer and a plurality of elements such as a power supply, a hard disk drive, a floppy disk drive, and CD-ROM drive are installed on the chassis at predetermined positions. The chassis also supports a printed circuit board (PCB) which controls the operation of the above noted elements.

In a computer, a motherboard or the PCB is designed to allow a user to repair or upgrade the computer. In order to upgrade the computer, the existing PCB is removed from the chassis prior to being changed to a new one.

In order to improve the work efficiency while repairing or changing the PCB, the chassis has to be designed to allow a user to easily install or remove the PCB to or from the chassis.

One earlier structure for mounting a PCB in a computer has a plurality of mounting bosses which have the same height and are formed on predetermined positions of the chassis. The PCB is placed above the mounting bosses prior to being attached to the bosses by a plurality of set screws.

However, the above-noted mounting structure has problems in that it is necessary to insert or remove all of the set screws one by one in order to mount or remove the PCB on or from the chassis.

In another earlier structure for mounting a PCB in the computer, the PCB is designed to be slidably movable on the chassis.

In order to accomplish the above noted slidable structure, a slidable moving means having a locking part at a corner of the bottom end is mounted to the bottom surface of the PCB in the same direction as a sliding direction of the PCB. A locking lever having a rounded bay is mounted to the top surface of the outside edge of the chassis at a predetermined position in such a way that the lever is rotatable on the chassis.

The above-noted slidable mounting structure has problems in that the locking lever is rotatably mounted to the chassis through a shaft such that the lever may be accidentally removed from the slidable moving means when the chassis is leaned on its side.

It is therefore necessary to manually and precisely readjust the position of the locking lever when the slidable moving means is moved to mount the PCB to the chassis. This is inconvenient to a user. Furthermore, the structure does not have any means for locking the lever so that the structure fails to stably hold the PCB on the chassis.

The following patents each disclose features in common with the present invention but do not teach or suggest the specifically recited structure for mounting a printed circuit board in an electronic appliance in accordance with the present invention: U.S. Pat. No. 5,668,696 to Schmitt, entitled Carriei-Based Mounting Structure For Computer Peripheral Chassis, U.S. Pat. No. 5,600,542 to Malgouires, entitled Modular Automation Device With A Locking Member, U.S. Pat. No. 4,628,413 to Speraw, entitled Card Cassette Ejector Apparatus, U.S. Pat. No. 5,428,507 to Chatel et al., entitled Front Panels For Rack-Mounted Printed Circuit Boards, U.S. Pat. No. 5,558,528 to Cheng et al, entitled Connector With Ejector, U.S. Pat. No. 5,676,556 to Yamaguchi et al., entitled Lever-Coupling Type Connector, U.S. Pat. No. 5,417,513 to Hayashi, entitled Lever Of Lever Type Connector, U.S. Pat. No. 5,140,501 to Takahashi et al., entitled Mechanism For Inserting And Withdrawing Printed Board Unit Of Electronics Circuit Device, U.S. Pat. No. 5,541,809 to Kakizaki et al., entitled Electronic Equipments Chassis Made From Bent Sheet Metal, and U.S. Pat. No. 5,692,208 to Felcman et al., entitled Lever Apparatus For An Ejector Mechanism In A Personal Computer.

SUMMARY OF THE INVENTION

Accordingly, the present invention has been made keeping in mind the above problems occurring in the earlier arrangements, and an object of the present invention is to provide a structure for mounting a PCB in electronic appliances such as computers, which detachably, slidably, quickly, precisely and easily mounts the PCB to the chassis of an electronic appliance without requiring any additional motion in the sliding movement of the PCB on the chassis, thus improving work efficiency and being convenient to users while repairing or changing the PCB in electronic appliances.

In order to accomplish the above object, the present invention provides a structure for mounting a printed circuit board (PCB) in an electronic appliance, comprising: a slidable moving means disposed on a bottom surface of the PCB; a PCB guide means, disposed on a chassis of the electronic appliance, for guiding a linear movement of the slidable moving means; two connectors respectively provided on the PCB and the chassis at corresponding positions, the connectors being electrically connected to each other when the PCB is completely set on the chassis; a locking lever rotatably mounted to the chassis so as to be rotated in opposite directions by the slidable moving means, normally maintaining a position of the PCB on the chassis and selectively releasing the PCB from the chassis; and a lever locking means for selectively locking the locking lever when the lever is in a PCB locking position, preventing the lever from being accidentally rotated to a PCB releasing position.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
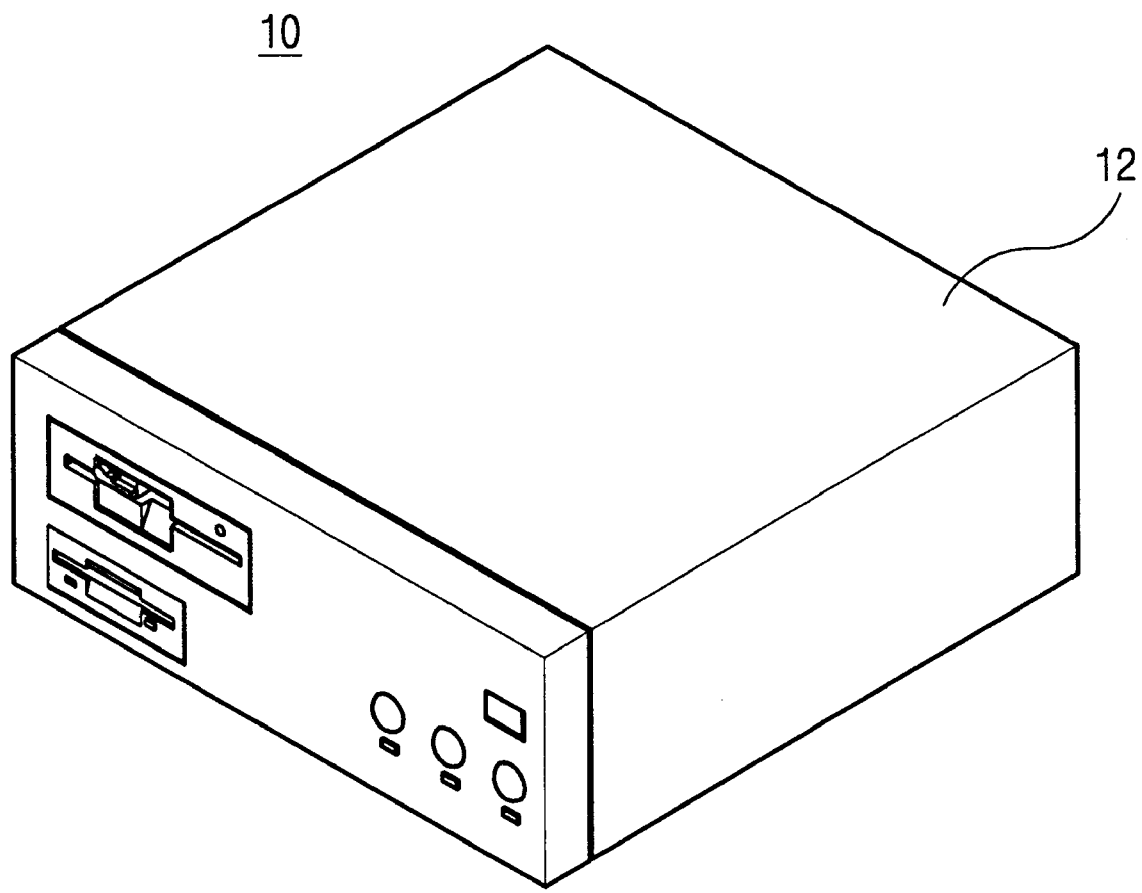
FIG. 1 is a perspective view showing the appearance of a prior art computer.
Figure 2:
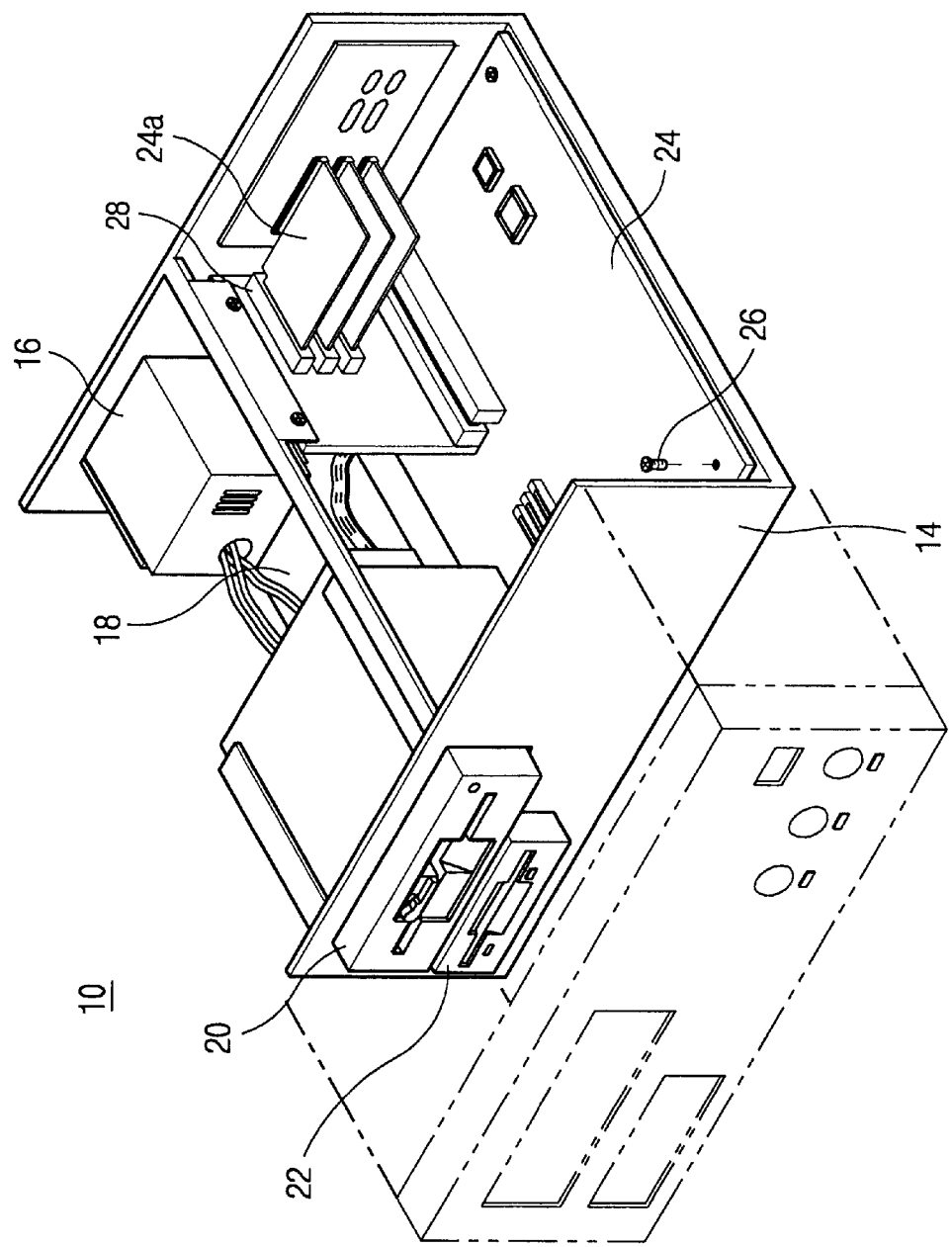
FIG. 2 is a perspective view showing the interior construction of a prior art computer, with a structure for mounting a PCB in the computer.
Figure 3:
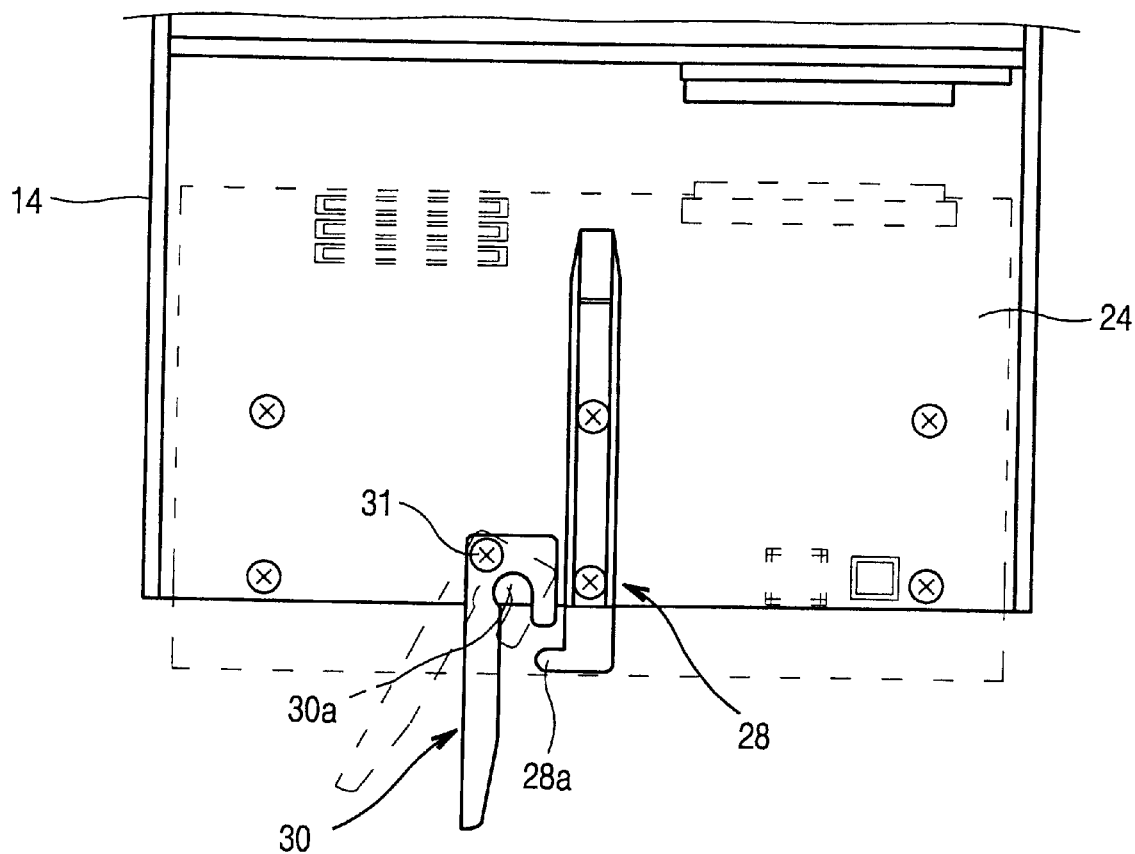
FIG. 3 is a plan view showing another earlier structure for mounting a PCB in the computer.

FIG. 1 is a perspective view showing the configuration of an earlier computer. FIGS. 2 and 3 each show earlier structures for mounting a PCB in a computer.

As shown in the drawings, a chassis 14 is provided in the housing of a computer or an electronic appliance. A plurality of elements, such as a power supply 16, a hard disc drive 18, a floppy disc drive 20 and a CD-ROM drive 22, are installed on the chassis 14 at predetermined positions. The chassis 14 also supports a printed circuit board (PCB) 24 which controls the operation of the above elements.

In a typical computer, a motherboard or the PCB 24 is designed to allow a user to repair or upgrade the computer. In order to upgrade the computer, the existing PCB 24 is removed from the chassis 14 prior to being changed to a new one. In other electronic appliances, the PCB 24 is designed to be easily repaired or changed to a new one when it is defective.

Therefore, in order to improve work efficiency while repairing or changing the PCB 24 of the electronic appliance, the chassis 14 has to be designed to allow a user to easily install or remove the PCB 24 to or from the chassis 14.

FIG. 2 shows an earlier structure for mounting a PCB 24 in a computer. As shown in the drawing, the mounting structure has a plurality of mounting bosses (not shown), which have the same height and are formed on predetermined positions of the chassis 14. The PCB 24 is placed above the mounting bosses prior to being attached to the bosses by a plurality of set screws 26 at the top of the PCB 24.

However, the above mounting structure is problematic in that it is necessary to tighten or loosen the set screws 26 one by one at the top of the PCB 24 in order to mount or remove the PCB 24 on or from the chassis 14, thus reducing work efficiency while mounting or removing the PCB 24. Particularly, in the case of a computer with a motherboard, the PCB 24 or the motherboard has to be often removed from the chassis 14 in order to upgrade the computer, so the PCB mounting structure with the set screws 26 remarkably reduces work efficiency while upgrading the computer.

FIG. 3 is a plan view showing another earlier structure for mounting a PCB in the computer. As shown in the drawing, this PCB mounting structure is designed to allow a PCB 24 to be slidably movable on the chassis 14, thus being slidably attached to or removed from the chassis 14.

In order to accomplish the above slidable structure, a slidable moving means 28, having a locking part 28a at a corner of the bottom end, is mounted to the bottom surface of the PCB 24 in the same direction as a sliding direction of the PCB 24. A locking lever 30, having a rounded bay 30a, is mounted to the top surface of the outside edge of the chassis 14 at a predetermined position in a way such that the lever 30 is rotatable on the chassis 14.

In the above mounting structure, when the PCB 24 slides on the chassis 14 so as to be mounted to the chassis 14, the locking lever 30 of the chassis 14 is caught by the locking part 28a of the slidable moving means 28, so the lever 30 is rotated in a predetermined direction and locks the slidable moving means 28 of the PCB 24, thus preventing the PCB 24 from being removed from the chassis 14. When the locking lever 30 is manually rotated in the opposite direction by a user, the lever 30 is removed from the slidable moving means 28, thus automatically separating the PCB 24 from the chassis 14.

However, the above slidable mounting structure is problematic in that since the locking lever 30 is rotatably mounted to the chassis 14 through a shaft 31, the lever 30 may be accidentally removed from the slidable moving means 28 when the chassis 14 is leaned on its side.

Therefore, it is necessary to manually and precisely readjust the position of the locking lever 30 when the slidable moving means 28 is moved to mount the PCB 24 to the chassis 14. The slidable mounting structure is thus inconvenient to users.

Another problem experienced in the slidable mounting structure is that the structure does not have any means for locking the lever 30, so that the structure fails to stably hold the PCB 24 on the chassis 14.

In the structure according to the preferred embodiment of this invention, the same elements as those of the earlier structures of FIGS. 1 to 3 are denoted by the same reference numerals as those of the earlier structures.

Figure 4:
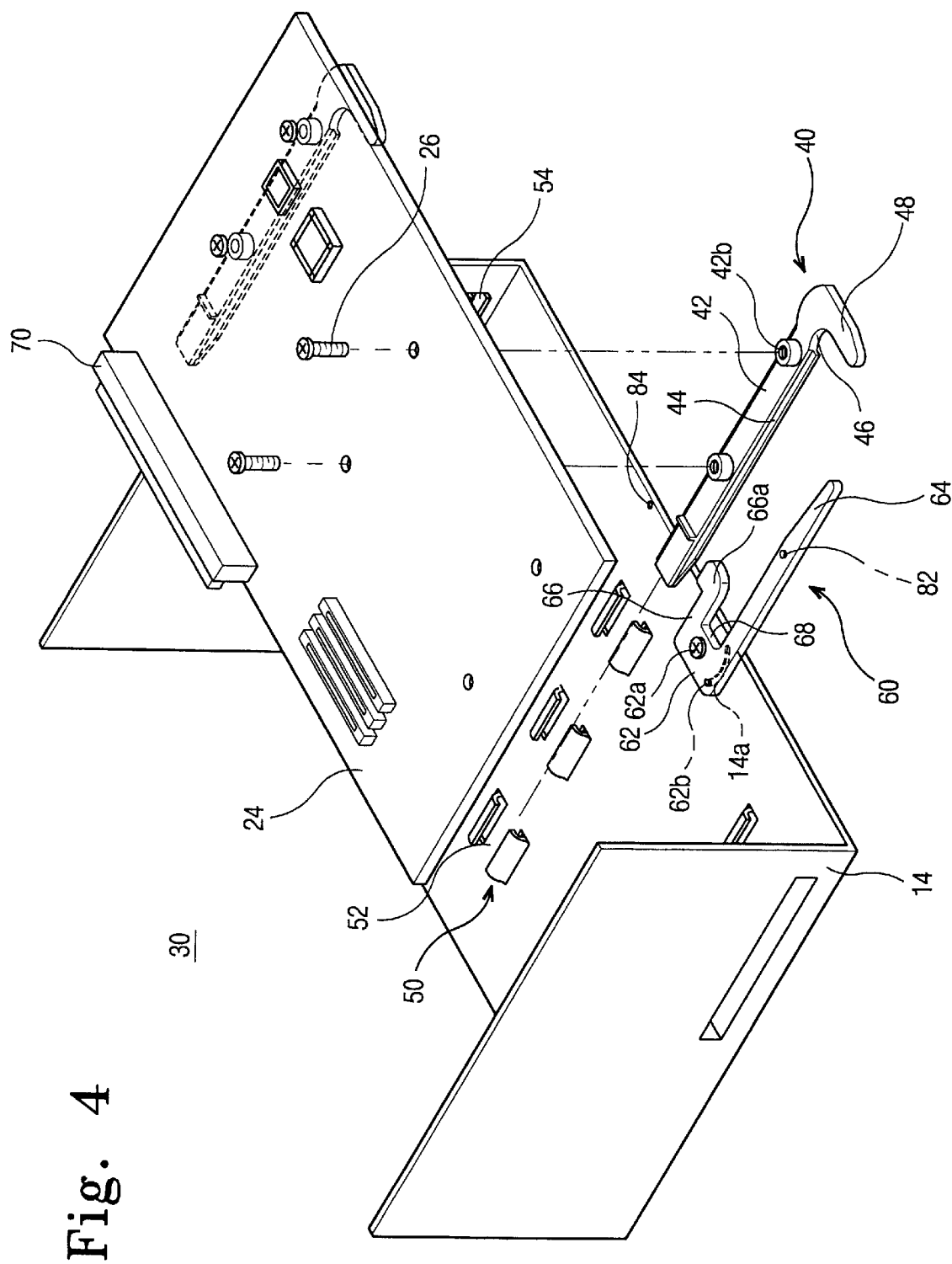
FIG. 4 is an exploded perspective view showing a structure for mounting a PCB in an electronic appliance in accordance with a preferred embodiment of the present invention.
Figure 5:
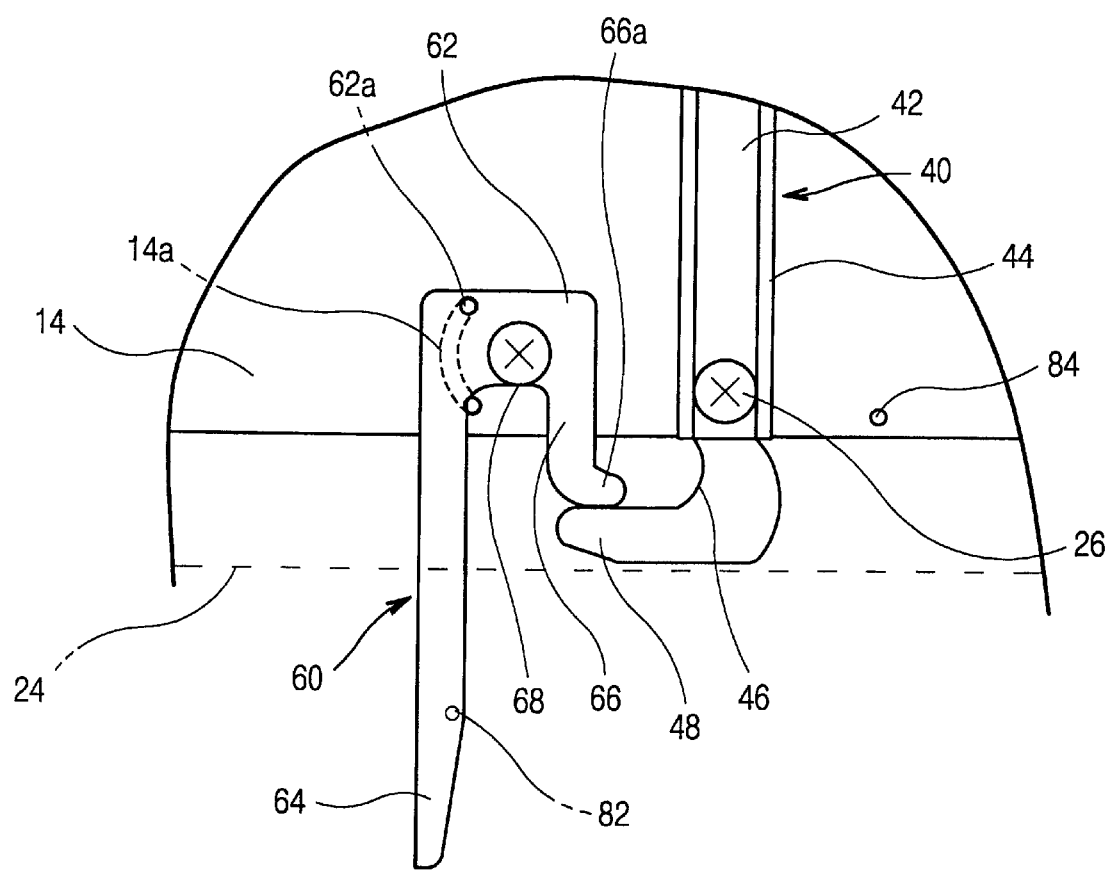
FIG. 5 is a plan view showing the relationship between a locking lever and a slidable moving means both included in the PCB mounting structure of this invention.

FIG. 4 is an exploded perspective view showing a PCB mounting structure in accordance with the preferred embodiment of this invention. FIG. 5 is a plan view showing the relationship between a locking lever and a slidable moving means both included in the above PCB mounting structure.

As shown in the drawings, the PCB mounting structure of this invention comprises a slidable moving means 40, a PCB guide means 50, a locking lever 60, two connectors 70 and 70', and a lever locking means. In the structure, the slidable moving means 40 allows a PCB 24 to be slidably mounted to or removed from the chassis 14 of an electronic appliance such as a computer. The PCB guide means 50 guides a slidable movement of the PCB 24 on the chassis 14, thus allowing the PCB 24 to be more precisely and stably movable on the chassis 14. The locking lever 60, rotatably mounted to the chassis 14, normally maintains the position of the slidable moving means 40 on the chassis 14 and selectively releases the moving means 40 from the chassis 14. The two connectors 70 and 70' are respectively provided on the PCB 24 and the chassis 14, thus electrically connecting the PCB 24 to the other elements on the chassis 14 when the PCB 24 is completely set on the chassis 14. The lever locking means selectively locks the locking lever 60 when the lever 60 is in a PCB locking position, thus preventing the lever 60 from being accidentally rotated to a PCB releasing position.

In the above PCB mounting structure, the slidable moving means 40 is produced separately from the PCB 24 and is mounted to the bottom surface of the PCB 24 in the same direction as a sliding direction of the PCB 24. The moving means 40 is fixed to the PCB 24 using a plurality of screws 26. In the present invention, two or more slidable moving means 40 may be arranged on the PCB 24 in accordance with the size of the PCB 24. Of course, it is preferable to regularly space out the two or more slidable moving means 40.

The guide means 50 is provided on the top and opposite side surfaces of the chassis 14 at a position around the PCB mounting area as best seen in FIG. 4. The guide means 50 extend in the same direction as the sliding direction of the PCB 24 on the chassis 14. In the preferred embodiment of the present invention, the guide means 50 comprises two types of guide members 52 and 54. That is, two rows of first guide members 52, used for guiding the skirt part 44 of the slidable moving means 40, are formed on the top surface of the chassis 14 at a position corresponding to the slidable moving means 40. The first guide members 52 thus allow the slidable moving means 40 to be more precisely and stably movable on the chassis 14. Of course, a plurality of parallel rows of first guide members 52 may be preferably formed on the chassis 14, thus effectively guiding the slidable moving means 40 regardless of the number of the moving means 40. The second guide members 54 are individually formed on the interior surface of each side wall of the chassis 14 at a position around the PCB mounting area. The above second guide members 54, extending in the same direction as the sliding direction of the PCB 24, guide both side edges of the PCB 24 when the PCB 24 slides on the chassis 14.

The locking lever 60 is rotatably mounted to the top surface of the outer edge of the chassis 14 at a position slightly diverged from the central axis of one row of the first guide members 52. The above locking lever 60 comes into contact with the slidable moving means 40 and is rotatable in either direction when the moving means 40 linearly moves on the chassis 14. Therefore, the locking lever 60 normally locks the position of the PCB 24 on the chassis 14 and selectively releases the PCB 24, thus allowing the PCB 24 to be removed from the chassis 14.

The above slidable moving means 40 consists of a longitudinal body 42, a skirt part 44 and a locking part 48. In the longitudinal body 42, a longitudinal groove 42*a*, having a predetermined depth, is axially formed on the bottom surface, while a plurality of mounting bosses 42*b* are formed on the top surface so as to be regularly spaced out. The skirt part 44, having a predetermined width, is formed along the lower edge of each side wall of the above longitudinal body 42. The locking part 48 is formed at the outside end of the body 42 and transversely protrudes in a direction, thus having a hook-shaped configuration. A rounded bay 46, having a radius of curvature, is formed at the inside corner between the body 42 and the locking part 48.

The locking lever 60 consists of a flat lever body 64, an actuating part 66, a contact part 66*a*, and a locking slot 68.

The flat lever body 64 extends to a given length and is provided with a wide mount 62 having a shaft hole 62*a*. The actuating part 66 extends from the wide mount 62 in a direction parallel to the lever body 64, thus facing the lever body 64 with the locking slot 68 being formed between the body 64 and the actuating part 66. The contact part 66*a* transversely extends to a length from the outside end of the actuating part 66. The locking slot 68, formed between the lever body 64 and the actuating part 66, is selectively brought into engagement with the locking part 48 of the slidable moving means 40 when the PCB 24 is slidably mounted to the chassis 14.

In the locking lever 60, a rotation guide pin 62*b*, having a predetermined length, is provided on the bottom surface of the wide mount 62 at a predetermined position. An arcuate guide slot 14*a*, having a radius of curvature, is formed on the top surface of the chassis 14, so that the guide pin 62*b* is movably received in the guide slot 14*a* and guides a rotating motion of the locking lever 60 on the chassis 14.

As shown in FIG. 5, the lever locking means comprises a locking protrusion 82 and a locking hole 84. The locking protrusion 82, having a predetermined height, is formed on the bottom surface of the lever body 64 at a predetermined position. The locking hole 84, having a predetermined depth, is formed on the top surface of the chassis 14 at a position corresponding to the terminal point of a rotating motion of the locking protrusion 82.

Figure 6:
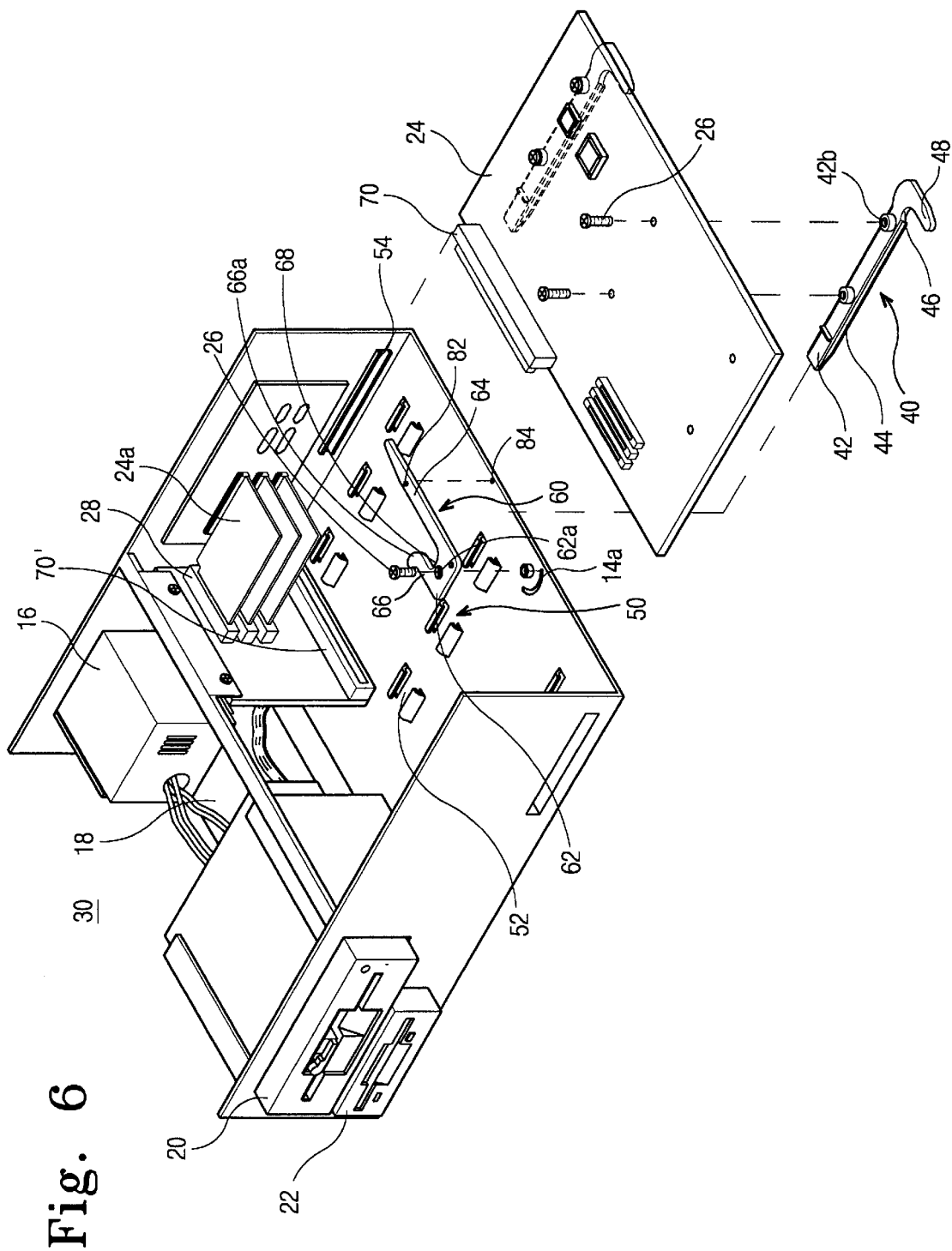
FIG. 6 is an exploded perspective view showing the PCB mounting structure of this invention used with a computer.

FIG. 6 is an exploded perspective view showing the PCB mounting structure of this invention used with a computer. As shown in the drawing, the chassis 14 of the computer is generally divided into two compartments. In the first compartment, the chassis 14 carries a power supply unit 16 and a hard disc drive 18 at the rear panel and carries a floppy disc drive 20 and a CD-ROM drive 22 at the front panel. In the second compartment, a PCB 24 is horizontally set in the lower portion, while a plurality of option cards 24*a* are set in a plurality of expansion slots 28 at a position above the PCB 24. The expansion slots 28 are electrically connected to the PCB 24.

In the PCB mounting structure for computers, two rows of first guide members 52, constituting the guide means 50, are provided on the top surface of the chassis 14 and extend in the same direction as the sliding direction of the PCB 24 on the chassis 14. A locking lever 60 is rotatably mounted to the top surface of the outer edge of the chassis 14. while a slidable moving means 40, which engages with and is guided by the first guide members 52, is mounted to the bottom surface of the PCB 24.

Figure 7:
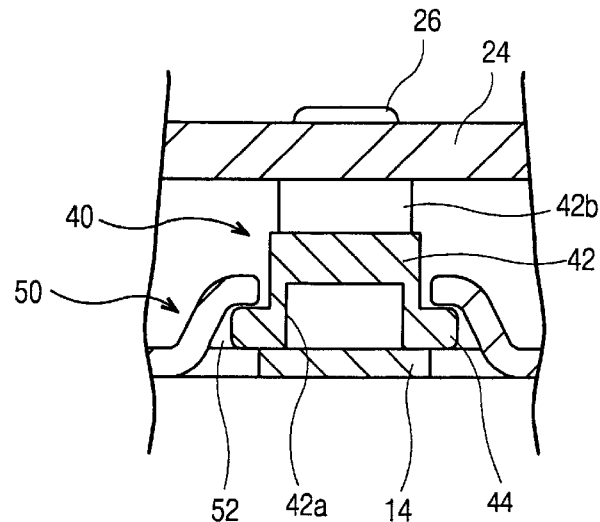
FIG. 7 is a sectional view showing the slidable moving means brought into engagement with guide members of the PCB mounting structure of this invention.

FIG. 7 is a sectional view showing the slidable moving means 40 brought into engagement with the first guide members 52. As shown in the drawing, the two rows of first guide members 52, individually having a predetermined length, are formed by partially cutting the top surface of the chassis 14 prior to bending upwardly the cut pieces. The first guide members 52 movably receive the skirt part 44 of the slidable moving means 40, thus guiding a slidable movement of the slidable moving means 40 on the chassis 14.

In the longitudinal body 42 of the ridable moving means 40, a longitudinal groove 42*a*, having a predetermined depth, is axially formed on the bottom surface, thus effectively reducing the frictional contact area between the top surface of the chassis 14 and the bottom surface of the body 42 and allowing the PCB 24 to be more easily mounted to and removed from the chassis 14.

The PCB mounting structure of this invention is operated as follows when a PCB 24 or a motherboard is mounted to or removed from a chassis 14.

Figure 8:
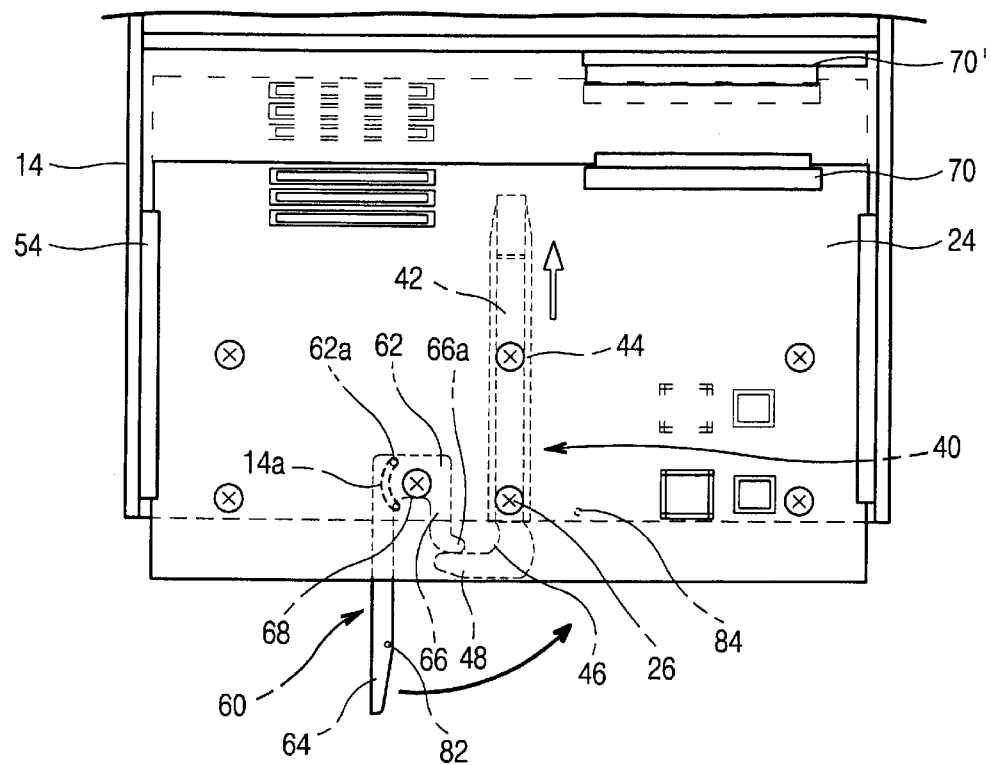
FIG. 8 is a plan view showing the operation of the PCB mounting structure of this invention when a PCB is slidably mounted to the chassis.

FIG. 8 is a plan view showing the operation of the above PCB mounting structure when a PCB 24 is slidably mounted to the chassis 14. As shown in the drawing, in order to mount a PCB 24 or a motherboard to the chassis 14, the PCB 24 is primarily arranged on the chassis 14 in a way such that the skirt part 44 of the slidable moving means 40 and both side edges of the PCB 24 are respectively aligned with the first and second guide members 52 and 54 of the guide means 50. Thereafter, the PCB 24 is pushed inwardly. The PCB 24 thus slides on the chassis 14 from the outside into the inside under the guide of the first and second guide members 52 and 54.

When the PCB 24 slides on the chassis 14 from the outside into the inside under the guide of the first and second guide members 52 and 54 as described above, the locking part 48 of the slidable moving means 40 comes into contact with the contact part 66a of the locking lever 60 prior to linearly moving to the inside of the chassis 14.

Figure 9:
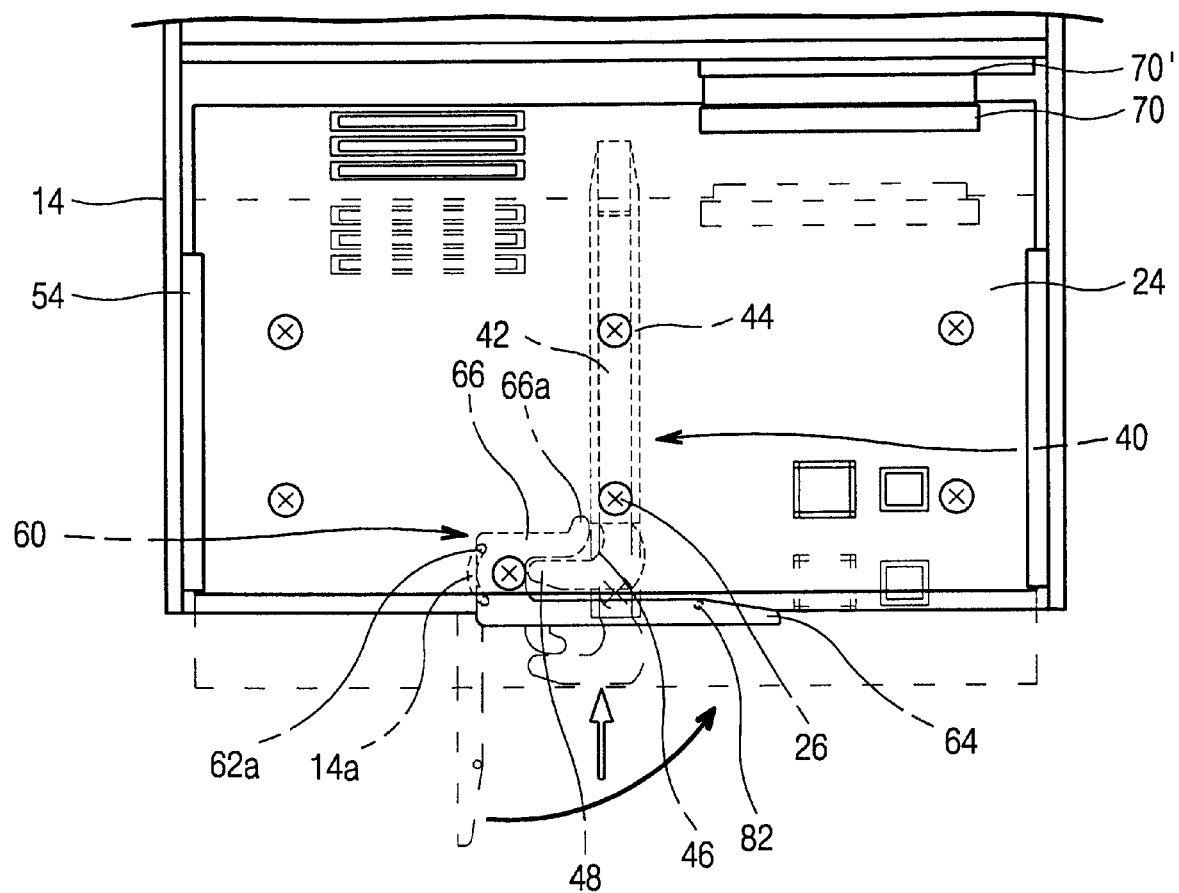
FIG. 9 is a plan view showing the PCB mounting structure of this invention when the PCB is completely set on the chassis.

As the locking part 48 of the slidable moving means 40 moves to the inside of the chassis 14 while being brought into contact with the contact part 66a of the lever 60, the lever body 64 of the locking lever 60 is rotated in a direction under the guide of the arcuate guide slot 14a of the chassis 14 as shown in FIG. 9. The longitudinal body 42 of the slidable moving means 40 is thus completely set on the chassis 14.

When the slidable moving means 40 of the PCB 24 is completely set on the chassis 14, the first connector 70, provided at the inside edge of the PCB 24, is connected to the second connector 70' of the chassis 14.

At the same time, the locking part 48 of the slidable moving means 40 is fitted into the locking slot 68 of the locking lever 60, while the contact part 66a of the locking lever 60 is fitted into the rounded bay 46 of the slidable moving means 40.

During the above operation for mounting the PCB 24 to the chassis 14, the rotating motion of the locking lever 60 is stably guided by the arcuate guide slot 14a of the chassis 14 cooperating with the guide pin 62b of the locking lever 60.

When the locking lever 60 is completely rotated to mount the PCB 24 to the chassis 14, the locking protrusion 82 of the lever locking means is seated in the locking hole 84 of the chassis 14 as shown in FIG. 9, thus locking the locking lever 60 in the PCB locking position and preventing the lever 60 from being accidentally rotated to a PCB releasing position.

Figure 10:
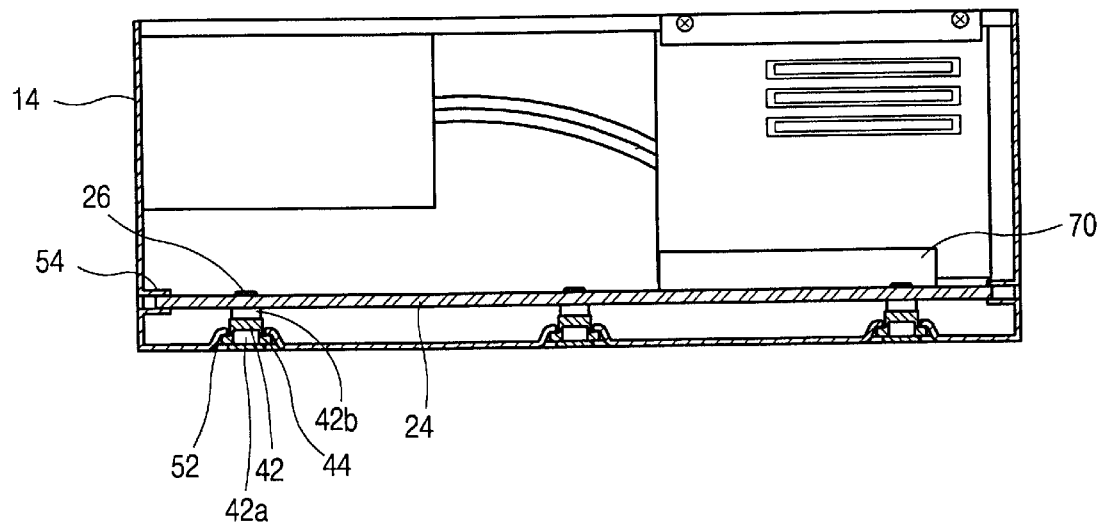
FIG. 10 is a sectional view showing the PCB completely set on the chassis.

FIG. 10 is a sectional view showing the PCB 24 completely set on the chassis 14. When the PCB 24 is completely set on the chassis 14 as shown in FIG. 10, the position of the PCB 24 is maintained by the skirt part 44 of the slidable moving means 40 which engages with the first guide members 52 of the chassis 14. In addition, the position of the PCB 24 on the chassis 14 is maintained by the locking part 48 of the slidable moving means 40 fitted into the locking slot 68 of the locking lever 60. The position of the PCB 24 on the chassis 14 is also maintained by the locking protrusion 82 of the lever locking means seated in the locking hole 84 of the chassis 14.

Figure 11:
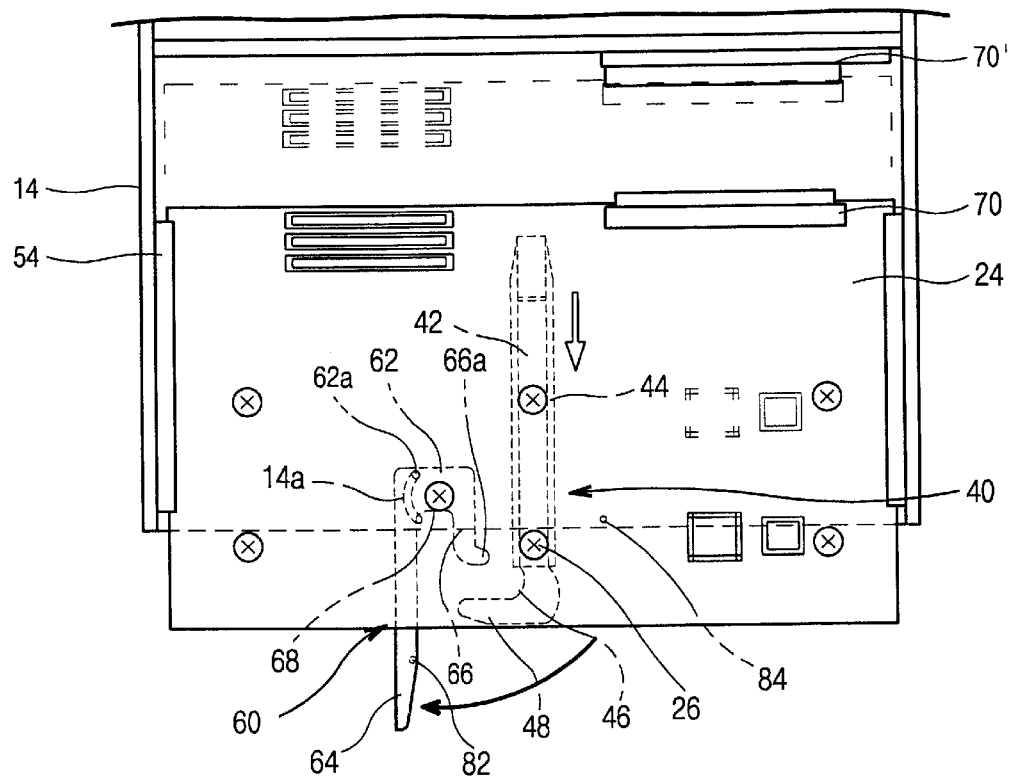
FIG. 11 is a plan view showing the operation of the PCB mounting structure of this invention when the PCB is slidably removed from the chassis.

FIG. 11 is a plan view showing the operation of the PCB mounting structure when the PCB 24 is removed from the chassis 14. As shown in the drawing, in order to remove the PCB 24 from the chassis 14, the lever body 64 of the locking lever 60 is manually levered outwardly, thus allowing the locking protrusion 82 of the lever locking means to be forcibly separated from the locking hole 84 of the chassis 14 prior to rotating the lever 60 in an opposite direction.

Therefore, the locking part 48 of the slidable moving means 40 is pushed outwardly by the contact part 66a of the locking lever 60. In addition, the first connector 70 of the PCB 24 is removed from the second connector 70' of the chassis 14, so that the PCB 24 may be removed from the chassis 14.

The PCB 24 can be manually pulled out from the chassis 14 under the guide of the first and second guide members 52 and 54 of the guide means 50.

Therefore, the PCB mounting structure for electronic appliances of this invention allows a user to easily repair or change the PCB.

As described above, the present invention provides a structure for detachably and slidably mounting a PCB in electronic appliances, thus allowing a user to easily mount and remove the PCB to or from the chassis of an electronic appliance. In the PCB mounting structure of this invention, a slidable moving means of a PCB performs a slidable appliance motion, while a locking lever of a chassis is rotatable in opposite directions so as to perform a latching motion for locking or releasing the slidable moving means. The PCB mounting structure of this invention thus allows a PCB to be detachably, slidably, quickly, precisely and easily mounted to the chassis, so the structure improves work efficiency and is convenient to users while repairing or changing the PCB.

The PCB mounting structure of this invention is also provided with a lever locking means, which selectively locks the locking lever when the lever is in a PCB locking position, thus preventing the lever from being accidentally rotated to a PCB releasing position.

The PCB mounting structure allows a user to easily and quickly mount a PCB to the chassis of an electronic appliance without using any set screws, thus remarkably improving work efficiency while repairing or changing the PCB.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A structure for mounting a printed circuit board (PCB) in an electronic appliance, comprising:

slidable moving means disposed on a bottom surface of the PCB for moving linearly into said appliance when an inwardly directed force is applied to said slidable moving means, and for moving linearly out of said appliance when an outwardly directed force is applied to said slidable moving means;

PCB guide means disposed on a chassis of the electronic appliance for contacting said slidable moving means and guiding a linear movement of said slidable moving means;

two connectors provided at respective positions on the PCB and the chassis, said connectors being electrically connected to each other when the PCB is completely set on the chassis;

a locking lever rotatably mounted to the chassis, adapted to rotate in a first direction when said slidable moving means travels into said appliance, and adapted to rotate in a second direction when said slidable moving means travels out of said appliance, said locking lever normally maintaining a position of the PCB on the chassis and being adapted to release the PCB from the chassis when rotated to a PCB releasing position; and lever locking means for selectively locking said locking lever when the locking lever is in a PCB locking position, and for preventing the locking lever from being accidentally rotated to the PCB releasing position.

2. The structure according to claim 1, said slidable moving means comprising:

a longitudinal body having a top surface, a bottom surface and sides, provided with an axial groove on the bottom surface, and provided with a plurality of regularly spaced mounting bosses on the top surface;

a skirt part formed along a lower edge of each side of said longitudinal body; and a locking part formed at an outside end of said longitudinal body and transversely protruding in a direction so as to have a hook-shaped configuration, with a rounded bay being formed at an inside corner between said longitudinal body and said locking part.

3. The structure according to claim 1, said locking lever comprising:

a flat lever body having an end provided with a wide mount;

an actuating part extending from said wide mount in a direction parallel to the lever body so as to face the lever body;

a contact part transversely extending from an outside end of said actuating part; and a locking slot formed between the lever body and the actuating part, said locking slot being adapted to engage with a locking part of said slidable moving means when the PCB is mounted to the chassis.

4. The structure according to claim 1, said lever locking means comprising:

a locking protrusion formed on a bottom surface of said locking lever; and a locking hole formed on a top surface of said chassis at a position corresponding to a terminal point of a rotating motion of said locking protrusion.

5. The structure according to claim 3, further comprising:

a rotation guide pin provided on a bottom surface of said wide mount of the flat lever body; and an arcuate guide slot formed on a top surface of said chassis for guiding the rotation guide pin when the locking lever is rotated in said first and second directions.

6. The structure according to claim 2, said locking lever comprising:

a flat lever body having an end provided with a wide mount;

an actuating part extending from said wide mount in a direction parallel to the lever body so as to face the lever body;

a contact part transversely extending from an outside end of said actuating part; and a locking slot formed between the lever body and the actuating part, said locking slot being adapted to engage with a locking part of said slidable moving means when the PCB is mounted to the chassis.

7. The structure according to claim 2, said lever locking means comprising:

a locking protrusion formed on a bottom surface of said locking lever; and a locking hole formed on a top surface of said chassis at a position corresponding to a terminal point of a rotating motion of said locking protrusion.

8. The structure according to claim 3, said lever locking means comprising:

a locking protrusion formed on a bottom surface of said locking lever; and a locking hole formed on a top surface of said chassis at a position corresponding to a terminal point of a rotating motion of said locking protrusion.

9. The structure according to claim 6, further comprising:

a rotation guide pin provided on a bottom surface of said wide mount of the flat lever body; and an arcuate guide slot formed on a top surface of said chassis for guiding the rotation guide pin when the locking lever is rotated in said first and second directions.

10. A structure for mounting a printed circuit board (PCB) in an electronic appliance, comprising:

slidable moving means disposed on a bottom surface of the PCB for moving linearly into said appliance when an inwardly directed force is applied to said slidable moving means, and for moving linearly out of said appliance when an outwardly directed force is applied to said slidable moving means;

PCB guide means disposed on a chassis of the electronic appliance for guiding a linear movement of said slidable moving means;

two connectors provided at respective positions on the PCB and the chassis, said connectors being electrically connected to each other when the PCB is completely set on the chassis;

a locking lever rotatably mounted to the chassis, adapted to rotate in a first direction when said slidable moving means travels into said appliance, and adapted to rotate in a second direction when said slidable moving means travels out of said appliance, said locking lever normally maintaining a position of the PCB on the chassis and being adapted to release the PCB from the chassis when rotated to a PCB releasing position; and lever locking means for selectively locking said locking lever when the locking lever is in a PCB locking position, and for preventing the locking lever from being accidentally rotated to the PCB releasing position;

wherein said slidable moving means comprises:

a longitudinal body having a top surface, a bottom surface and sides, provided with an axial groove on the bottom surface, and provided with a plurality of regularly spaced mounting bosses on the top surface;

a skirt part formed along a lower edge of each side of said longitudinal body; and a locking part formed at an outside end of said longitudinal body and transversely protruding in a direction so as to have a hook-shaped configuration, with a rounded bay formed at an inside corner between said longitudinal body and said locking part.

11. A structure for mounting a printed circuit board (PCB) in an electronic appliance, comprising:

slidable moving means disposed on a bottom surface of the PCB for moving linearly into said appliance when an inwardly directed force is applied to said slidable moving means, and for moving linearly out of said appliance when an outwardly directed force is applied to said slidable moving means;

PCB guide means disposed on a chassis of the electronic appliance for guiding a linear movement of said slidable moving means;

two connectors provided at respective positions on the PCB and the chassis, said connectors being electrically connected to each other when the PCB is completely set on the chassis;

a locking lever rotatably mounted to the chassis, adapted to rotate in a first direction when said slidable moving means travels into said appliance, and adapted to rotate in a second direction when said slidable moving means travels out of said appliance, said locking lever normally maintaining a position of the PCB on the chassis and being adapted to release the PCB from the chassis when rotated to a PCB releasing position; and lever locking means for selectively locking said locking lever when the locking lever is in a PCB locking position, and for preventing the locking lever from being accidentally rotated to the PCB releasing position;

wherein said lever locking means comprises:
a locking protrusion formed on a bottom surface of said locking lever; and
a locking hole formed on a top surface of said chassis at a position corresponding to a terminal point of a rotating motion of said locking protrusion.

12. A slidable device disposed on a bottom surface of a printed circuit board (PCB) for mounting the PCB in an electronic appliance, said slidable device comprising:

a longitudinal body having a top surface, a bottom surface and sides, provided with an axial groove on the bottom surface, and provided with a plurality of regularly spaced mounting bosses on the top surface;

a skirt part formed along a lower edge of each side of said longitudinal body; and a locking part formed at an outside end of said longitudinal body and transversely protruding in a direction so as to have a hook-shaped configuration, with a rounded bay formed at an inside corner between said longitudinal body and said locking part.

13. A structure for mounting a printed circuit board (PCB) in an electronic appliance, comprising:

slidable moving means disposed on a bottom surface of the PCB for moving linearly into said appliance when an inwardly directed force is applied to said slidable moving means, and for moving linearly out of said appliance when an outwardly directed force is applied to said slidable moving means;

PCB guide means disposed on a chassis of the electronic appliance for guiding a linear movement of said slidable moving means;

a locking lever rotatably mounted to the chassis, adapted to rotate in a first direction when said slidable moving means travels into said appliance, and adapted to rotate in a second direction when said slidable moving means travels out of said appliance, said locking lever normally maintaining a position of the PCB on the chassis and being adapted to release the PCB from the chassis when rotated to a PCB releasing position; and lever locking means for selectively locking said locking lever when the locking lever is in a PCB locking position, and for preventing the locking lever from being accidentally rotated to the PCB releasing position;

wherein said lever locking means comprises:
a locking protrusion formed on a bottom surface of said locking lever; and
a locking hole formed on a top surface of said chassis at a position corresponding to a terminal point of a rotating motion of said locking protrusion.

* * * * *